(12) United States Patent
Rossi et al.

(10) Patent No.: US 11,177,090 B2
(45) Date of Patent: Nov. 16, 2021

(54) DETERMINING A STATE OF A SWITCHING UNIT

(71) Applicant: Schneider Electric Industries SAS, Rueil-Malmaison (FR)

(72) Inventors: Nicolas Rossi, Sassenage (FR); Diego Alberto, Corenc (FR); Philippe Brun, Bernin (FR)

(73) Assignee: Schneider Electric Industries SAS, Rueil Malmaison (FR)

(*) Notice: Subject to any disclaimer, the term of this patent is extended or adjusted under 35 U.S.C. 154(b) by 0 days.

(21) Appl. No.: 17/027,769

(22) Filed: Sep. 22, 2020

(65) Prior Publication Data

US 2021/0090823 A1 Mar. 25, 2021

(30) Foreign Application Priority Data

Sep. 25, 2019 (FR) ...................... 1910562

(51) Int. Cl.
*H01H 1/00* (2006.01)
*H01H 11/00* (2006.01)

(52) U.S. Cl.
CPC ...... *H01H 11/0062* (2013.01); *H01H 1/0015* (2013.01)

(58) Field of Classification Search
USPC ....................................................... 307/139
See application file for complete search history.

(56) References Cited

U.S. PATENT DOCUMENTS

| 2011/0251607 A1* | 10/2011 | Kruecker | A61B 18/1206 606/34 |
| 2016/0018254 A1* | 1/2016 | Wechselberger | G01G 23/3735 177/1 |

FOREIGN PATENT DOCUMENTS

| DE | 19504714 A1 | 8/1996 |
| DE | 19604203 A1 | 8/1997 |
| EP | 0222645 A1 | 5/1987 |
| EP | 0789380 A1 | 8/1997 |
| EP | 1347479 A1 | 9/2003 |
| EP | 2405454 A1 | 1/2012 |
| FR | 2807204 A1 | 10/2001 |

OTHER PUBLICATIONS

Search Report and Written Opinion for French Patent Application No. FR1910562 dated May 27, 2020, 10 pages.

* cited by examiner

*Primary Examiner* — Toan T Vu
*Assistant Examiner* — Xuan Ly
(74) *Attorney, Agent, or Firm* — Locke Lord LLP

(57) ABSTRACT

Method for detecting a state of a switching unit, the switching unit comprising an element that is movable between a first position and a second position.

11 Claims, 5 Drawing Sheets

DETERMINING A STATE OF A SWITCHING UNIT

TECHNICAL FIELD

The present invention relates to a method for detecting a state of a switching unit.

The invention also relates to a switching unit implementing such a method.

PRIOR ART

A line supplying power to an electrical load conventionally comprises at least one switching unit. The switching unit comprises a mechanism for actuating pairs of contacts that are movable relative to one another in order to break or make, if necessary, the flow of an electrical current.

A malfunction of the actuation mechanism of the switching unit can have serious consequences, for example through the appearance of an undesirable electrical arc during a poor mutual displacement of the contacts.

Also, in order to ensure satisfactory maintenance, it is currently necessary to check the good mechanical performance and the good operation of such a switching unit at regular intervals.

However, although it can be generally satisfactory, this maintenance can prove inadequate in that a problem can occur just after a check has been made, and can therefore be detected too late, only upon the next maintenance operation.

Furthermore, these maintenance operations require a shutdown of the operation of the switching unit, sometimes with a long and tedious dismantling/reassembly of certain elements.

Finally, these maintenance operations do not make it possible to differentiate, on the one hand, a potentially critical and serious malfunction of the switching unit, and, on the other hand, a relatively less problematical malfunction, linked generally to an inherent wear or gradual aging that are inherent to the elements of the switching unit but that still allow the latter to operate.

One of the aims of the invention is therefore to propose a method for detecting the state of the switching unit that is simple, reliable and cost-effective, which makes it possible to ensure a maintenance and diagnosis of its operation that are more effective.

SUMMARY

The invention improves the situation.

A method is proposed for detecting a state of a switching unit, the switching unit comprising an element that is movable between a first position and a second position, the method comprising the following steps, for an iteration of index k greater than or equal to 2:
a) acquiring at least one measurement indicative of a displacement of the movable element between the first position and the second position in the iteration of index k;
b) comparing at least the measurement acquired in the given iteration k with a first set of measurements acquired in the preceding iterations 1 to k−1,
c) generating a first alarm based on the comparison obtained in step b) to indicate that the switching unit is in an unavailable state;
d) comparing at least the measurement acquired in the given iteration k with a second set of measurements acquired in the preceding iterations 1 to k−1, and
e) generating a second alarm based on the comparison obtained in step d) to indicate that the switching unit is in a degraded state.

In this way, a diagnosis of the switching unit is obtained that is representative of the real situation, and not just simulated, of the mechanical state of the elements of the switching unit.

Furthermore, the invention makes it possible to discriminate between an unavailable state requiring urgent maintenance, and a degraded state requiring only reinforced monitoring and maintenance, to ensure the correct operation of the switching unit.

The features set out in the following paragraphs can, optionally, be implemented. They can be implemented independently of one another or in combination with one another.

According to one embodiment, the first set comprises, advantageously consists of, the measurements acquired between the iterations k−L and k−1, L being an integer greater than or equal to 1.

According to another embodiment, the comparison obtained in step b) is performed by application of the Chauvenet criterion.

According to another embodiment, the comparison obtained in step b) is performed according to the following formula:

$$D[k] = \frac{|X[k] - \bar{X}_L[k]|}{\sigma_L[k]}$$

$$\bar{X}_L[k] = \sum_{n=1}^{L} x[k-n]/L$$

$$\sigma_L[k] = \sqrt{\sum_{n=1}^{L} (x[k-n] - \bar{X}_L[k])^2 / L - 1}$$

According to another embodiment, the second set comprises, advantageously consists of, the measurements acquired between the iterations N and N+M−1, N and M being integers greater than or equal to 1.

According to another embodiment, the comparison obtained in step d) is performed according to the following formula:

$$R[k] = \frac{\bar{X}_M[k]}{\bar{X}_{M_{ref}}}$$

$$\bar{X}_M[k] = \sum_{n=0}^{M-1} x[k-n]/M$$

$$\bar{X}_{M_{ref}} = \sum_{n=N}^{N+M-1} x[n]/M$$

According to another embodiment, the first alarm and/or the second alarm are generated when the comparisons obtained in step b) and/or in step d) are greater than a threshold value.

According to another embodiment, the measurement corresponds to a range of rotation lying between 20% and 80% of a displacement travel of the movable element between the first position and the second position.

According to another embodiment, the measurement is equal to the duration of the displacement of the movable element between two intermediate positions lying between the open position and the closed position.

According to another embodiment, the method comprises an additional step: f) memorizing the iteration measurement of index k acquired in step a).

According to another embodiment, the acquired measurement corresponds to a real-condition transition of a switching module between an open position and a closed position.

Also proposed is a switching unit implementing the method according to the invention.

According to one embodiment, the movable element is a main rotary lever.

BRIEF DESCRIPTION OF THE DRAWINGS

Other features, details and advantages will emerge on reading the following detailed description, and on analysing the attached drawings, in which.

DESCRIPTION OF EMBODIMENTS

The drawings and the following description contain, for the most part, elements of a certain nature. They will therefore be able to be used not only to better understand the present disclosure, but also to contribute to the definition thereof, as appropriate.

Switching Unit

Figure 1:
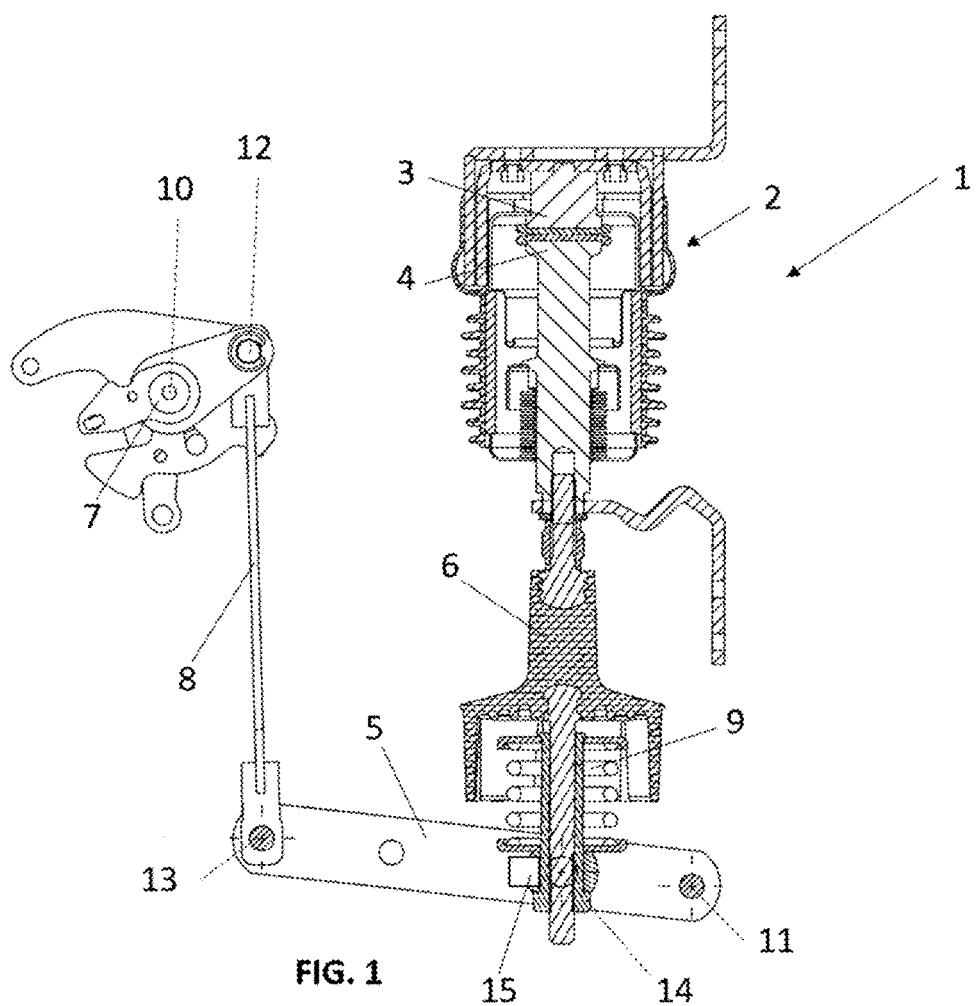
FIG. 1 is a cross-sectional view of a particular example of a module of a switching unit that can implement the detection method according to the invention.

FIG. 1 illustrates a switching module 1 of a switching unit according to a particular embodiment of the invention, illustrating also the document FR2807204.

Although described in the context of a particular switching unit, the invention should however not be limited to that aspect. In particular, any other switching unit architecture can be envisaged. The switching unit can be chosen from among a switch, a circuit breaker, a contactor, a fuse-switch and an automatic re-closer.

The invention is more particularly suited to medium voltage and/or high voltage switching units. In the present document, the terms "medium voltage" and "high voltage" are used in their usual accepted meaning, namely that the term "medium voltage" designates a voltage which is greater than 1000 volts in alternating current and 1500 volts in direct current, but which does not exceed 52 000 volts in alternating current and 75 000 volts in direct current, while the term "high voltage" designates a voltage which is strictly greater than 52 000 volts in alternating current and 75 000 volts in direct current.

The switching unit, as illustrated in a nonlimiting manner by FIG. 1, comprises a driving mechanism (not illustrated) as well as the switching module 1. The driving mechanism can be of any known type, notably comprising a pole shaft 7. It can for example be a mechanism of the type described in document EP 0222645, EP 0789380 or EP 1347479, provided with an arming and closure subassembly comprising a closure spring and an opening subassembly comprising an opening spring.

Referring to FIG. 1, the switching module 1 also conventionally comprises a vacuum interrupter 2 forming an enclosure which encloses a fixed contact 3 and a movable contact 4.

The movable contact 4 is configured to be displaced relative to the fixed contact in such a way that the switching module 1 can be alternately in an open position, in which the contacts 3, 4 are away from one another, and in a closed position, in which the contacts 3, 4 are in contact with one another.

Outside the vacuum interrupter 2, the movable contact 4 is linked to a lever 5, via an insulating arm 6.

In operation, when the contacts 3, 4 are in the open position, the closure spring drives the pole shaft 7 in the anticlockwise direction. The movement is transmitted, notably by a link rod 8 as illustrated in FIG. 1, to the lever 5 which pivots in the clockwise direction and which compresses a spring 9. The closure force is then transmitted by the spring 9 to the movable contact 4.

When the contacts 3, 4 are in the closed position, an opening spring drives the pole shaft 7 in the clockwise direction. The movement is transmitted, notably by the link rod 8 as illustrated in FIG. 1, to the lever 5 which pivots in the counter-clockwise direction, driving the movable contact 4 into the open position. The breaking of an electrical current passing through the fixed and movable contacts 3, 4 is thus achieved.

This kinematic chain thus makes it possible to define a plurality of geometrical axes of rotation allowing a pivoting movement of several movable elements of the switching unit. According to the embodiment of FIG. 1, there are obtained a first geometrical axis 10 of pivoting of the pole shaft 7, a second geometrical axis 11 of pivoting of the lever 5, a third geometrical axis 12 of pivoting of the link rod 8 relative to the cranks of the pole shaft 7, a fourth geometrical axis 13 of pivoting of the link rod 8 relative to the lever 5, and a fifth geometric axis 14 of pivoting of the insulating part 6 relative to the lever 5.

Other geometrical axes of rotation and other movable elements can also exist in the kinematic chain of the switching unit for the transition between the open position and the closed position. These other geometrical axes and other movable elements are not detailed hereinbelow.

Thus, the switching unit comprises a plurality of movable elements pivoting about geometrical axes of rotation in its operation.

The invention relates to a method for detecting a state of operation of the switching unit based on the time of displacement of one or more of these movable elements.

Detection Method

The method aims to detect a state of the switching unit based on time measurements acquired in relation to a movable element of the switching unit. It is thus possible to know the mechanical performance of the switching unit and deduce therefrom a diagnosis relating to its operation.

The movable element can advantageously be chosen to be the lever 5 as described previously. However, the measurements can be acquired concerning any other movable element of the switching unit, notably as described above.

Figure 2:
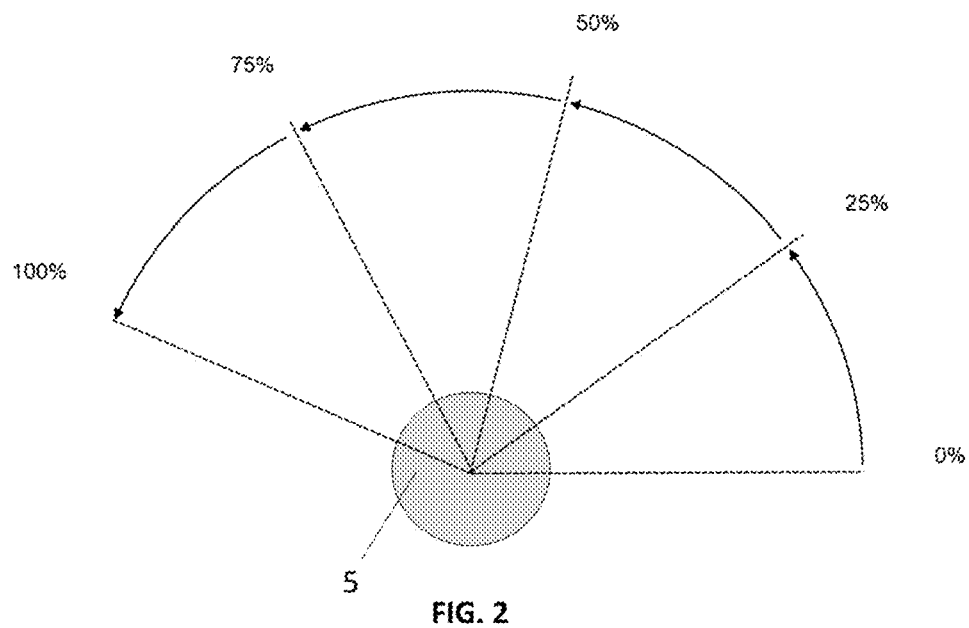
FIG. 2 schematically represents a displacement travel of a movable element of the switching unit of FIG. 1 between a first position, corresponding to 0% of the displacement travel, and a second position, corresponding to 100% of the displacement travel.

FIG. 2 illustrates the rotational displacement travel, advantageously continuous, of the movable element when the switching module passes between the closed position and the open position. In the closed position, the movable element is in a first position, corresponding to 0% of its displacement travel. In the open position, the movable element is in a second position, corresponding to 100% of its displacement travel. The displacement travel can be measured in the form of an angle of rotation or of a distance between the open position and the closed position.

Between the first position and the second position, the movable element passes through intermediate positions, for example illustrated in FIG. 2 by positions corresponding respectively to 25%, 50% and 75% of the displacement travel.

The time measurements acquired according to the method correspond advantageously to the transition of the movable element between two intermediate positions. The intermediate positions can advantageously be chosen from a range of displacement travel values lying between 20% and 80%, even more particularly chosen between 25% and 75%.

The choice of such ranges of values makes it possible to obviate any instabilities observed close to the 0% and 100% limit values of displacement travel which are less representative of the state of the switching unit because they are more sensitive to the various frictions, to the trip modes and to the inherent bounces upon the transition of the switching module into the open and closed positions.

From the time measurements acquired, the method makes it possible to perform a statistical analysis to detect a plurality of states of the switching unit.

The statistical analysis is advantageously performed on the basis of relative values, obtained by comparison with one another of measurements or sets of measurements acquired at different instants with the same switching unit. This thus makes it possible to limit the inclusion of external factors that are difficult to predict, such as temperature or the occurrence of mechanical vibrations, which are likely to otherwise influence the measurements.

A first state of the switching unit is qualified as unavailable state. In this unavailable state, the switching unit can no longer operate correctly. In particular, the transition of the switching module from the open position to the closed position, or vice versa, is likely not to be ensured at a suitable speed, possibly even not to be ensured at all.

An unavailable state is characterized by an abrupt change in mechanical performance, and notably in the displacement time, of a movable element of the switching unit.

An unavailable state can be due to a poor operation of an element of the switching unit, notably of the switching module or of the driving mechanism, for example because of a leak in the switching fluid (oil, vacuum, etc.) or the breaking of an element. In some cases, the detection of an unavailable state leads to a prohibition of use of the switching unit until it is repaired or replaced.

A second state of the switching unit is qualified as degraded state. In this degraded state, the switching unit can still operate, but less effectively than previously. In particular, the transition of the switching module from the open position to the closed position, or vice versa, is likely to be performed at a less suitable speed.

A degraded state is characterized by a gradual change over time of the mechanical performance, and notably of the displacement time, of a movable element of the switching unit.

A degraded state can be due to wear or aging of an element of the switching unit, notably of the switching module or of the driving mechanism, for example an increasing limpness of the springs of the actuation mechanism, an increase in the mechanical friction of the kinematic chain of the various movable elements in the switching unit, or an increase in the resisting torque on the lever of the switching unit. The detection of a degraded state makes it possible to intervene early enough on the switching unit to subsequently avoid a serious and potentially critical failure.

The method can possibly detect other states of the switching unit, not described hereinbelow.

Hereinbelow, the steps of the detection method according to the invention are described in relation to FIG. 3. The method is reiterated in several successive iterations. Each iteration corresponds to a transition of the switching module between the closed position and the open position. An iteration thus corresponds to a real-condition use of the switching unit, that is to say in its operation on an electrical power supply line.

Figure 3:
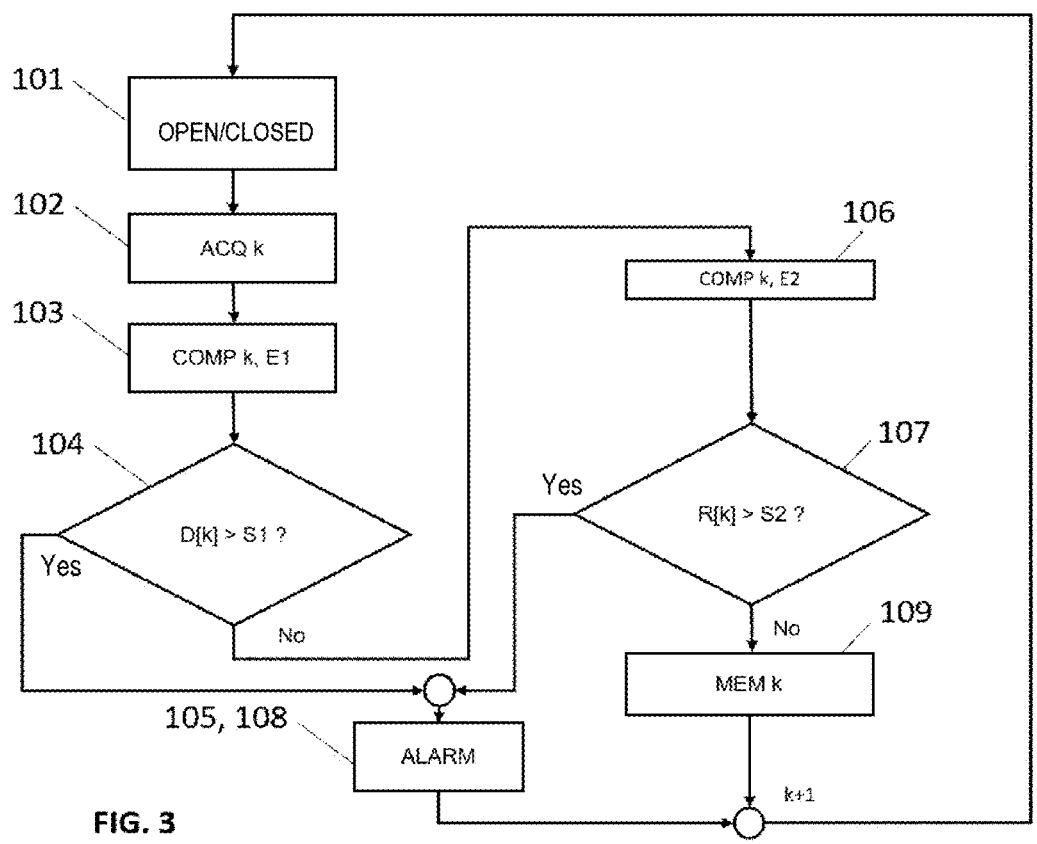
FIG. 3 is a schematic representation of an embodiment of the detection method according to the invention.

More particularly, FIG. 3 is described for an iteration of index k, k being an integer greater than or equal to 2.

The switching unit is first of all ready for operation, the switching module being generally either in the closed position, or in the open position.

In a step 101, the switching module passes into the other of the open or closed positions, in particular to break or make the electrical current on the electrical power supply line.

There is thus acquired, in a step 102, at least one measurement indicative of a displacement of the movable element between the first position and the second position.

The measurement can notably be acquired by means of a rotation sensor 15, illustrated schematically in FIG. 1, such as a mechanical, capacitive, inductive, resistive or other sensor, configured to obtain a measurement indicative of the displacement of the movable element.

The measurement can be a time or speed quantity or any other quantity which measures the ratio of a trend to time.

In a step 103, at least the acquired iteration measurement of index k is compared with a first set E1 of measurements acquired in the preceding iterations 1 to k−1. As a variant, it is also possible to compare a set of measurements, notably comprising the iteration measurement of index k, with the first set E1.

Advantageously, the first set E1 depends on the iteration k. In particular, the first set E1 comprises, or consists of, measurements which vary as a function of the iteration k concerned.

The comparison can be performed in different ways. According to one embodiment, the first set E1 can comprise, advantageously only, measurements acquired between the iterations k−L and k−1, L being an integer greater than or equal to 1. As an example, L can be equal to 50, the first set E1 then comprising all of the measurements acquired in 50 iterations preceding the iteration of index k. Obviously, other first sets are possible comprising measurements acquired at instants more or less far away from the iteration measurement of index k.

According to one embodiment, the comparison with the first set E1 is performed using a score D, also called "z score" or "standard score". Such a score D makes it possible to express, as a standard deviation number, the distance between the acquired measurement of iteration of index k and the average of the measurements of the first set E1.

More particularly, the score D implements the Chauvenet test, which makes it possible to determine whether the acquired measurement x[k] of iteration of index k can be considered as an aberrant or non-aberrant measurement with respect to the other preceding measurements of the first set E1. The score D can be calculated according to the following formula:

$$D[k] = \frac{|X[k] - \bar{X}_L[k]|}{\sigma_L[k]}$$

with:

$$\bar{X}_L[k] = \sum_{n=1}^{L} x[k-n]/L$$

$$\sigma_L[k] = \sqrt{\sum_{n=1}^{L}(x[k-n] - \bar{X}_L[k])^2 / L - 1}$$

In a step 104, the calculated score D is compared with a first threshold value S1.

If the score D is greater than the first threshold value S1, an alarm is generated in a step 105 to warn that the switching unit is in the unavailable state as described above. Indeed, this means that the iteration measurement of index k is particularly far away from the measurements contained in the first set E1, such that a recent change in the switching unit has degraded its operation.

If the score is less than the first threshold value S1, in a step 106 at least the measurement acquired in the iteration of index k is compared with a second set E2 of measurements acquired in the preceding iterations 1 to k−1. It is also possible to compare a set of measurements, notably comprising the iteration measurement of index k, with the second set E2.

According to one embodiment, the second set E2 can comprise, advantageously only, measurements acquired between the iterations N and N+M−1, N and M being integers greater than or equal to 1. As an example, N can be equal to 1 and M can be equal to 50, the second set E2 then comprising all of the first 50 measurements acquired. The second set E2 can thus comprise the values tested by the manufacturer of the switching unit (also called factory exit values). Obviously, as for the first set E1, other second sets are possible comprising measurements acquired at instants more or less far away from the iteration measurement of index k.

Advantageously, the second set E2 therefore comprises measurements which do not depend on the iteration k concerned. Compared to the first set E1, the second set E2 thus comprises measurements that are fixed or acquired in iterations relatively far away from the iteration measurement of index k.

The comparison can be performed in different ways. According to one embodiment, the comparison with the second set E2 is performed using a ratio R. The ratio R expresses the relative difference between the average of all of the measurements acquired in the M iterations preceding the iteration x[k] of index k and the average of the measurements of the second set E2.

More particularly, the ratio R is calculated according to the following formula:

$$R[k] = \frac{\bar{X}_M[k]}{\bar{X}_{M_{ref}}}$$

with:

$$\bar{X}_M[k] = \sum_{n=0}^{M-1} x[k-n]/M$$

$$\bar{X}_{M_{ref}} = \sum_{n=N}^{N+M-1} x[n]/M$$

In a step 107, the calculated ratio R is compared with a second threshold value S2.

If the ratio R is greater than the second threshold value S2, an alarm is generated in a step 108 to warn that the switching unit is in the degraded state as described previously. Indeed, that means that a gradual drift of the measurements relative to the measurements of the second set E2 is being observed, such that this drift could prove prejudicial to the operation of the switching unit.

If the ratio R is less than the second threshold value S2, no alarm is generated.

Finally, in a step 109, the iteration measurement of index k is memorized. To this end, the switching unit can comprise a memory or transmit the acquired measurements for storage on a remote server (not illustrated).

The method can then be repeated for an iteration of index k+1 when the switching unit is once again ready for operation.

Experimental Results

Figure 4A:
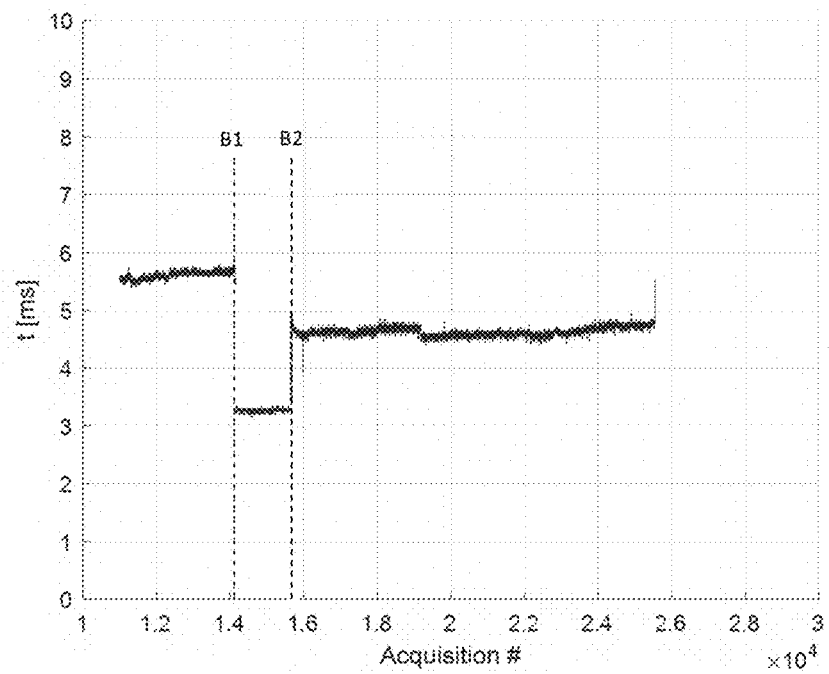
FIG. 4A is a representation of several acquisitions of measurements of the time needed for a movable element to cover between 25% and 75% of its displacement travel upon a transition of the switching module from a closed position to an open position.
Figure 4B:
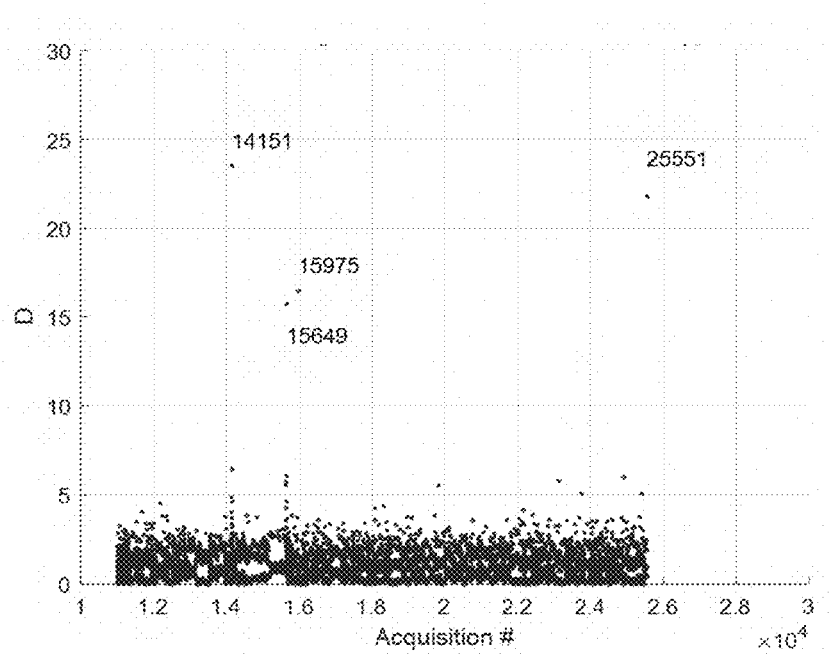
FIG. 4B is a representation of a score making it possible to compare each measurement of FIG. 4A with a first set comprising the preceding 50 measurements.
Figure 4C:
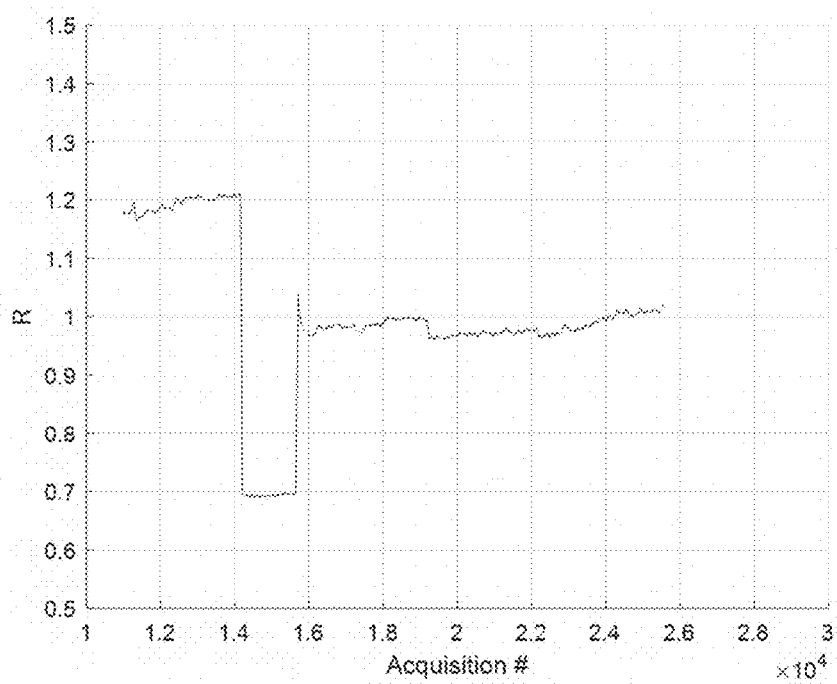
FIG. 4C is a representation of the ratio making it possible to compare each measurement of FIG. 4A with a second set comprising the first 50 measurements.

FIG. 4A, FIG. 4B and FIG. 4C illustrate the implementation of the detection method according to a first embodiment.

In FIG. 4A, measurements acquired according to this first embodiment are observed. Each measurement corresponds to the time needed for the movable element to cover a displacement travel between the 25% and 75% intermediate positions in a transition from the first position to the second position (corresponding to a transition of the switching module from the closed position to the open position).

The measurements are represented for the switching module of a phase of the electrical current. However, the results obtained from these measurements can be transposed to the switching modules of the other phases of the electrical current.

Abrupt disconnections, illustrated in FIG. 4A by the lines B1 and B2, correspond to operations of maintenance or of replacement of elements actually performed on the switching unit, having led to a modification of the switching characteristics and therefore of the ensuing measurements. These disconnections should not therefore be taken into account in the method according to the invention.

In particular, after an abrupt disconnection, the measurements of the first and second sets E1, E2, which allow the comparison with the measurements acquired subsequently, are reset to define new reference values.

FIG. 4B is a representation of the score D obtained according to the Chauvenet test described above, making it possible to compare each measurement of FIG. 4A with a first set E1 comprising the 50 iterations directly preceding said measurement.

In said FIG. 4B, it can be seen that some measurements (notably the measurements 14151, 15649, 15975 and 25551) obtain a high score D, greater than 15, even greater than 20. These measurements are therefore likely to exceed a predetermined threshold dependent notably on the switching unit concerned, and thus characterize an unavailable state of the switching unit.

FIG. 4C is a representation of the ratio R obtained as described above, making it possible to compare each measurement of FIG. 4A with a second set E2 comprising the first 50 measurements acquired on the switching unit.

In said FIG. 4C, it can be seen that some measurements obtain a ratio R lower than 1 (corresponding to a speed of displacement that is relatively faster compared to the second set E2) or a ratio R greater than 1 (corresponding to a speed of displacement that is relatively slower). These measurements are therefore likely to exceed a predetermined threshold dependent notably on the switching unit concerned, and thus characterize a degraded state of the switching unit linked to an inappropriate closure/opening speed of the switching module.

Generally, and excluding any abrupt disconnection or change, it can be seen that the ratio R has a tendency to increase over time reflecting gradual wear and aging of the switching unit that is likely to lead to a degraded state.

Figure 5A:
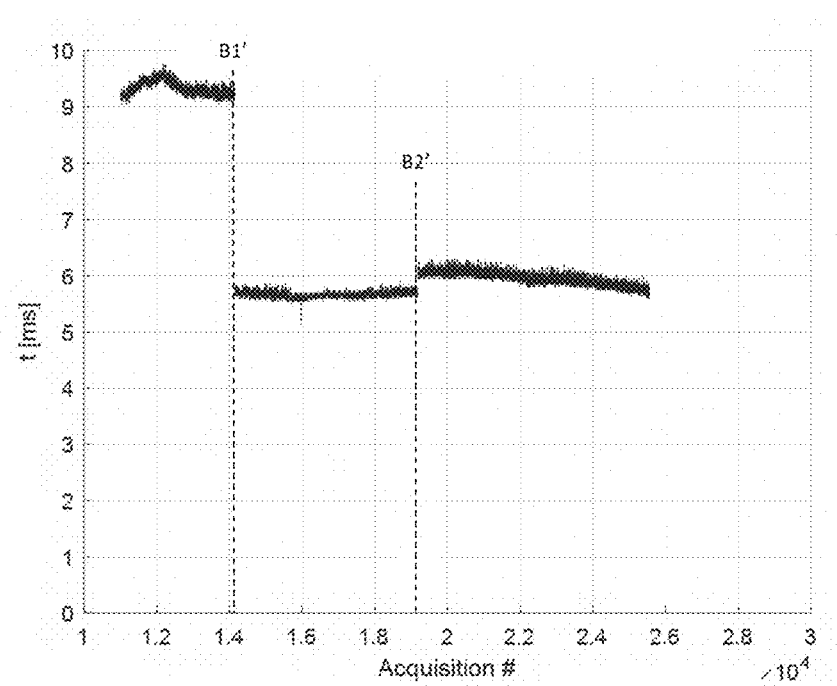
FIG. 5A is a representation of several acquisitions of measurements of the time needed for a movable element to cover between 25% and 75% of its displacement travel upon a transition of the switching module from the open position to the closed position.
Figure 5B:
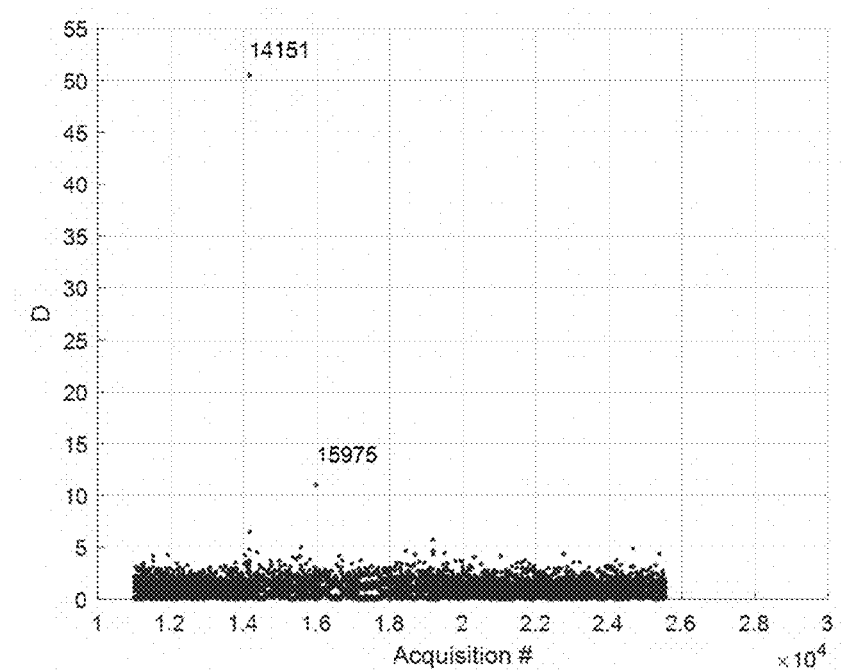
FIG. 5B is a representation of the score making it possible to compare each measurement of FIG. 5A with a first set comprising the preceding 50 measurements.
Figure 5C:
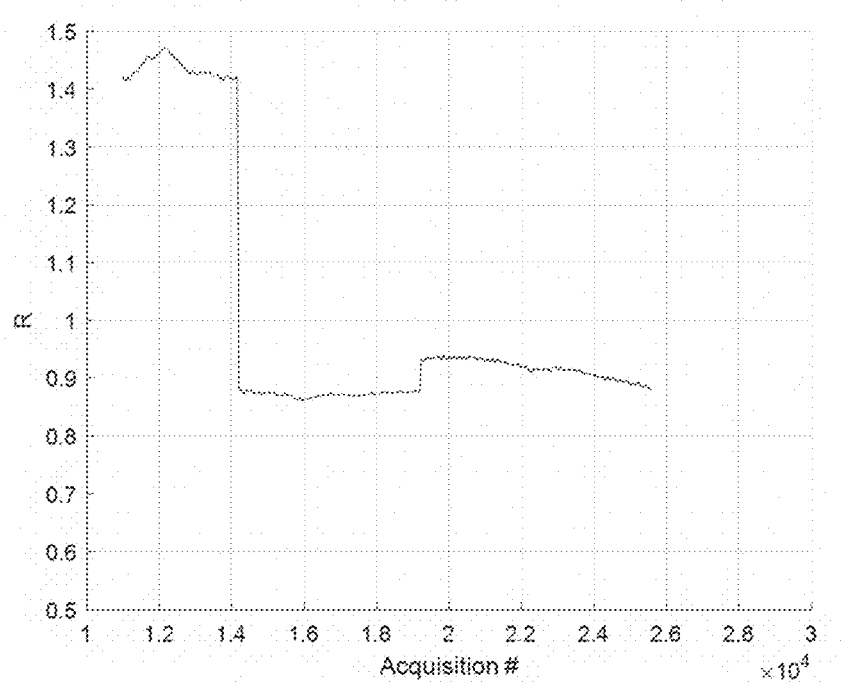
FIG. 5C is a representation of the ratio making it possible to compare each measurement of FIG. 5A with a second set comprising 50 measurement acquisitions.

FIG. 5A, FIG. 5B and FIG. 5C illustrate the implementation of the detection method according to a second embodiment.

In FIG. 5A, measurements acquired according to this second embodiment can be observed. Each measurement corresponds to the time needed for the movable element to cover a displacement travel between the 25% and 75% intermediate positions in a transition from the second position to the first position (corresponding to a transition of the switching module from the open position to the closed position).

The measurements are represented for the switching module of a phase of the electrical current. However, the results obtained from these measurements can be transposed to the switching modules of the other phases of the electrical current.

In the same way as for FIG. 4A, the abrupt disconnections, illustrated in FIG. 5A by the lines B1' and B2', correspond to operations of maintenance or of replacement of elements actually performed on the switching unit, having led to a modification of the switching characteristics and therefore of the subsequent measurements. These disconnections should not therefore be taken into account in the method according to the invention.

FIG. 5B is a representation of the score D obtained according to the Chauvenet test described above, making it possible to compare a measurement of FIG. 5A with a first set E1 comprising the 50 iterations directly preceding said measurement.

In said FIG. 5B, it can be seen that some acquisitions (notably the measurements 14151 and 15975) obtain a high score D, greater than 10, even greater than 50. These measurements are therefore likely to exceed a predetermined threshold and thus characterize an unavailable state of the switching unit.

FIG. 5C is a representation of the ratio R obtained as described above, making it possible to compare each measurement of FIG. 5A with a second set E2 comprising the first 50 measurements acquired from the switching unit.

In said FIG. 5C, it can be seen that some acquisitions obtain a ratio R less than 1 (corresponding to a faster displacement speed) or a ratio R greater than 1 (corresponding to a slower displacement speed). These measurements are therefore likely to exceed a predetermined threshold, and thus characterize a degraded state of the switching unit linked to an inappropriate closure/opening speed of the switching module.

Obviously, the invention is not limited to the embodiments described previously and supplied purely by way of example. It encompasses various modifications, alternative forms and other variants that the person skilled in the art could envisage within the framework of the present invention and notably all the combinations of the different embodiments described previously, that can be taken separately or in association.

In particular, although the comparisons have advantageously been illustrated above by the use of a particular score D and ratio R to determine the state of the switching unit, other comparison methods also implementing a ratio or an order-based relationship between measurements indicative of a displacement of the movable element can be envisaged.

Finally, the method is described above only for the detection of two states, unavailable or degraded. However, this method could advantageously be generalized to other states characterizing the operation and/or the mechanical state of a switching unit.

The invention claimed is:

1. Method for detecting a state of a switching unit, the switching unit comprising an element that is movable between a first position and a second position, the method comprising the following steps, for an iteration of index k being an integer:
   a) acquiring at least one measurement indicative of a displacement of the movable element between the first position and the second position on the iteration index k;
   b) comparing at least the measurement acquired in the given iteration k with a first set of a plurality of measurements acquired in the preceding iterations 1 to k−1, the first set comprising a plurality of measurements acquired between the iterations k−L and k−1, L being an integer greater than or equal to 1;
   c) generating a first alarm based on the comparison obtained in step b) to indicate that the switching unit is in an unavailable state;
   d) comparing at least the measurement acquired in the given iteration k with a second set of a plurality of measurements acquired in the preceding iterations 1 to k−1, the second set comprising a plurality of measurements acquired between the iterations N and N+M−1, N and M being integers; and
   e) generating a second alarm based on the comparison obtained in step d) to indicate that the switching unit is in a degraded state.

2. The method according to claim 1, wherein the comparison obtained in step b) is performed by application of the Chauvenet criterion.

3. The method according to claim 1, wherein the comparison obtained in step b) is performed on the basis of a score D according to the following formula:

$$D[k] = \frac{|X[k] - \bar{X}_L[k]|}{\sigma_L[k]}$$

with:

$$\bar{X}_L[k] = \sum_{n=1}^{L} x[k-n]/L$$

$$\sigma_L[k] = \sqrt{\sum_{n=1}^{L} (x[k-n] - \bar{X}_L[k])^2 / L - 1}.$$

4. The method according to claim 1, wherein the comparison obtained in step d) is performed on the basis of a ratio R according to the following formula:

$$R[k] = \frac{\bar{X}_M[k]}{\bar{X}_{M_{ref}}}$$

with:

$$\bar{X}_M[k] = \sum_{n=0}^{M-1} x[k-n]/M$$

$$\bar{X}_{M_{ref}} = \sum_{n=N}^{N+M-1} x[n]/M.$$

5. The method according to claim 1, wherein the first alarm and/or the second alarm are generated when the comparisons obtained in step b) and/or in step d) are greater than a threshold value.

6. The method according to claim 1, wherein the measurement corresponds to a range of rotation lying between 20% and 80% of a displacement travel of the movable element between the first position and the second position.

7. The method according to claim 1, wherein the measurement is equal to the duration of the displacement of the movable element between two intermediate positions lying between the open position and the closed position.

8. The method according to claim 1, comprising an additional step:

f) memorizing the iteration measurement of index k acquired in step a).

9. The method according to claim 1, wherein the acquired measurement corresponds to a real-condition transition of a switching module between an open position and a closed position.

10. Switching unit implementing the method according to claim 1.

11. The switching unit according to claim 10, wherein the movable element is a main rotary lever.

* * * * *